(12) United States Patent
Jabbour et al.

(10) Patent No.: US 9,768,797 B2
(45) Date of Patent: Sep. 19, 2017

(54) RECEIVER FOR SIMULTANEOUS SIGNALS IN CARRIER AGGREGATION

(71) Applicant: Nokia Technologies Oy, Espoo (FI)

(72) Inventors: Chadi Jabbour, Berkeley, CA (US); Seyed Majid Homayouni, Berkeley, CA (US); Sudhir Aggarwal, Fremont, CA (US); Vason P. Srini, Berkeley, CA (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/931,665

(22) Filed: Nov. 3, 2015

(65) Prior Publication Data

US 2016/0269042 A1    Sep. 15, 2016

Related U.S. Application Data

(60) Provisional application No. 62/132,418, filed on Mar. 12, 2015.

(51) Int. Cl.
*H04L 27/00* (2006.01)
*H03M 3/00* (2006.01)

(52) U.S. Cl.
CPC ........... *H03M 3/406* (2013.01); *H03M 3/462* (2013.01)

(58) Field of Classification Search
CPC .............................. H03M 3/406; H03M 3/462
USPC ........................... 375/316; 341/110; 370/328
See application file for complete search history.

(56) References Cited

U.S. PATENT DOCUMENTS

| | | | |
|---|---|---|---|
| 6,020,783 A | 2/2000 | Coppola | |
| 6,301,965 B1 * | 10/2001 | Chu | G01P 15/131 |
| | | | 73/514.18 |
| 6,590,943 B1 * | 7/2003 | Ali | H03D 3/007 |
| | | | 375/316 |

(Continued)

OTHER PUBLICATIONS

Kimmo Koli, Member, IEEE, Sami Kallioinen, Member, IEEE, Jarkko Jussila, Member, Kimmo Koli, Sami Kallioinen, Jarkko Jussila, Pete Sivonen and Aarno Pärssinen, "A 900-MHz Direct Delta-Sigma Receiver in 65 nm CMOS," IEEE journal of Solid State Circuits, vol. 45, 2010.

(Continued)

*Primary Examiner* — Daniel Washburn
*Assistant Examiner* — Fitwi Hailegiorgis
(74) *Attorney, Agent, or Firm* — Mintz Levin Cohn Ferris Glovsky and Popeo, P.C.

(57) ABSTRACT

Methods and apparatus, including computer program products, are provided for receivers. In one aspect there is provided an apparatus. The apparatus may include an in-phase sigma delta receiver coupled to a radio frequency input port providing at least a first carrier aggregation signal and a second carrier aggregation signal; and a quadrature phase sigma delta receiver coupled to the radio frequency input port providing at least the first carrier aggregation signal and the second aggregation signal, wherein the in-phase sigma delta receiver and the quadrature phase sigma delta receiver each include a resonator stage circuitry including at least one variable capacitor that varies notch frequencies to provide passbands for the first carrier aggregation signal and the second carrier aggregation signal. Related apparatus, systems, methods, and articles are also described.

20 Claims, 9 Drawing Sheets

(56) References Cited

U.S. PATENT DOCUMENTS

| | | | | |
|---|---|---|---|---|
| 8,055,235 B1* | 11/2011 | Gupta | ............ | H04B 1/525 |
| | | | | 455/296 |
| 8,687,736 B1 | 4/2014 | Huynh | | |
| 2003/0040294 A1* | 2/2003 | Staszewski | ............ | H03D 7/125 |
| | | | | 455/337 |
| 2013/0194114 A1* | 8/2013 | Ritter | ............ | H03M 3/368 |
| | | | | 341/110 |
| 2015/0372698 A1* | 12/2015 | Talty | ............ | H04B 1/001 |
| | | | | 370/328 |

OTHER PUBLICATIONS

Mikko Englund, Kim B. Östman, Olli Viitala, Mikko Kaltiokallio, Kari Stadius, Kimmo Koli and Jussi Ryynänen, "A Programmable 0.7-to-2.7GHz Direct ΔΣ Receiver," ISSCC , 2014.

Sundström, et al., 19.5 A Receiver for LTE Rel-11 and Beyond Supporting Non-Contiguous Carrier Aggregation. ISSCC 2013 / Session 19 / Wireless Transceivers for Smart Devices. 2013 IEEE International Solid-State Circuits Conference. 336-7.

Winoto, "Downconverting Sigma-Delta A/D Converter for a Reconfigurable RF Receiver," Berkeley, 2009.

Wu, E. Alon and B. Nlkolic, "A wideband 400 MHz-to-4 GHz direct RF-to-digital multimode DS receiver," IEEE Journal of Solid-State Circuits, 2014.

* cited by examiner

RECEIVER FOR SIMULTANEOUS SIGNALS IN CARRIER AGGREGATION

CROSS-REFERENCE TO RELATED APPLICATIONS

This application claims the benefit of U.S. provisional patent application Ser. No. 62/132,418, filed on Mar. 12, 2015 and entitled "RECEIVER FOR SIMULTANEOUS SIGNALS IN CARRIER AGGREGATION" which is incorporated by reference herein in its entirety.

STATEMENT OF GOVERNMENT SPONSORED SUPPORT

This invention was made with Government support under Agreement No. HR0011-12-9-0013, awarded by DARPA. The Government has certain rights in the invention.

FIELD

The subject matter disclosed herein relates to wireless communications.

BACKGROUND

A user equipment, such as a mobile wireless devices and the like, may be mobile in the sense that it may enter and/or exit a plurality of cells that serve the user equipment with access to and from the public land mobile network. For example, when the user equipment enters a cell, the network may send a command to the user equipment to perform a handover to that cell in order to couple to the serving cell. The user equipment may then proceed to be configured to measure the serving cell and/or other cells, report measurements of the serving cell and/or other cells to the network, and the like. After having executed the handover, the user equipment may become operational on the serving cell and thus user data can flow to and from the network.

Some user equipment may be configured to operate using carrier aggregation. Carrier aggregation refers to using one or more portions of the radio frequency spectrum (also referred to as spectrum chunks, bands, or frequencies) to carry data between the user equipment and the network—increasing thus data throughput, when activated by the network. These spectrum chunks may be contiguous or non-contiguous and may be symmetric or asymmetric (for example, a different quantity of spectrum chunks allocated to the uplink and downlink) Typically, one of the spectrum chunks is designated a primary cell, serving as an anchor carrier, while one or more additional spectrum chunks are referred to as secondary cells (Scells).

SUMMARY

Methods and apparatus, including computer program products, are provided for receivers.

In one aspect there is provided an apparatus. The apparatus may include an in-phase sigma delta receiver coupled to a radio frequency input port providing at least a first carrier aggregation signal and a second carrier aggregation signal; and a quadrature phase sigma delta receiver coupled to the radio frequency input port providing at least the first carrier aggregation signal and the second aggregation signal, wherein the in-phase sigma delta receiver and the quadrature phase sigma delta receiver each include a resonator stage circuitry including at least one variable capacitor that varies notch frequencies to provide passbands for the first carrier aggregation signal and the second carrier aggregation signal.

In some example embodiments, one of more variations may be made as well as described in the detailed description below and/or as described in the following features. The resonator stage circuitry may include at least one additional integration stage including the at least one variable capacitor. The at least one capacitor may vary the notch frequencies by at least moving zeroes of a second order and/or higher order loop filter of the resonator stage circuitry. The at least one capacitor may include at least one of a first integration capacitor, a loop filter capacitor, a second integration capacitor, a third integration capacitor, or a sampling capacitor. The apparatus may include a mixer stage to downsample a signal received from the radio frequency input port, wherein the mixer stage may further include the first integration capacitor, and wherein the first integration capacitor may be further coupled to a transfer capacitance stage circuitry. The resonator stage circuitry may include the second integration capacitor coupled on a first side to the transfer capacitance stage circuitry and on a second side to an input of an operational transconductance amplifier. The resonator stage circuitry may include the loop filter capacitor coupled to the output of the operational transconductance amplifier, and wherein the loop filter capacitor may be further coupled to the second integration capacitor. The resonator stage circuitry may include the third integration capacitor coupled to the output of the operational transconductance amplifier and a quantizer input. The resonator stage circuitry may include the sampling capacitor coupled to the input of the operational transconductance amplifier, and wherein the sampling capacitor may be further coupled to the output of the operational transconductance amplifier. The apparatus may further include at least one decimator coupled the in-phase sigma delta receiver and the quadrature phase sigma delta receiver. The apparatus may further include signal cancellation circuitry to remove at least one unwanted signal from an output signal generated by the in-phase sigma delta receiver and the quadrature phase sigma delta receiver. The signal cancelation circuitry may include a 90 degree phase shifter, delay circuitry, and at least one combiner. The apparatus may be included in a user equipment. The radio frequency input port may be configured to receive at least of a down converted signal at an intermediate frequency.

It is to be understood that both the foregoing general description and the following detailed description are exemplary and explanatory only and are not restrictive. Further features and/or variations may be provided in addition to those set forth herein. For example, the implementations described herein may be directed to various combinations and subcombinations of the disclosed features and/or combinations and subcombinations of several further features disclosed below in the detailed description.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

Figure 1A:
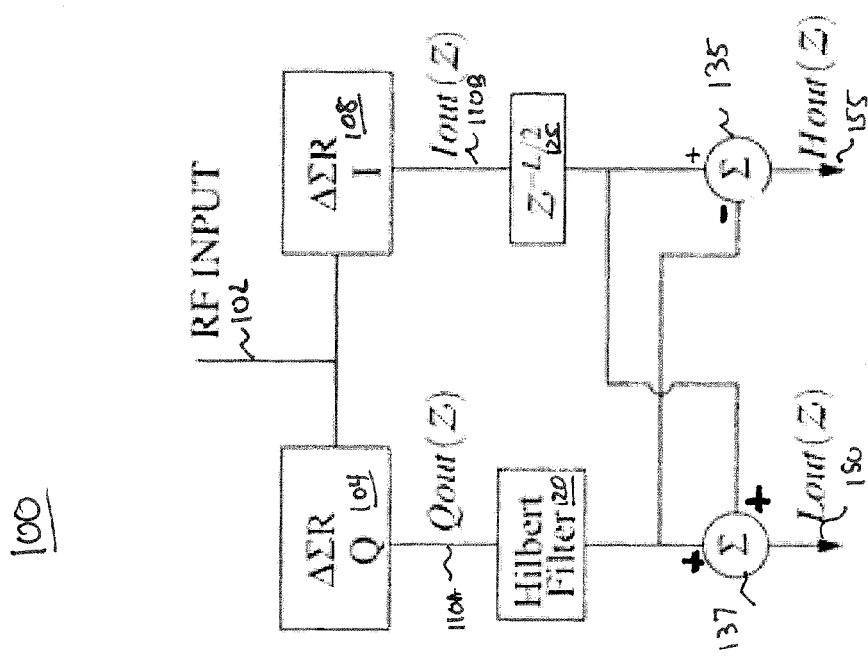
FIG. 1A depicts an example of a sigma delta receiver, in accordance with some example embodiments.

Like labels are used to refer to same or similar items in the drawings.

DETAILED DESCRIPTION

When multiple cellular receivers at a given user equipment are used to receive multiband signals in carrier aggregation, the use of multiple cellular receivers makes the system relatively costly, bulky, and power inefficient, especially in the case of mobile wireless communication systems. In some example embodiments, there is provided a single receiver that can simultaneously receive a plurality of carrier signals transmitted in accordance with for example carrier aggregation.

In some example embodiments, this single receiver may be implemented as a sigma delta receiver, such as a down converting sigma delta receiver. The down converting sigma delta receiver may be configured, in accordance with some example embodiments, to receive carrier signals (at different frequencies and/or bands) transmitted in carrier aggregation. To that end, the down converting sigma delta receiver's quantization noise at the frequencies or bands being received may be adjusted, in accordance with some example embodiments, by adding zeros to the receiver's noise transfer function at certain offset frequencies, as further described below.

To illustrate further, consider carrier aggregation having two 10 MHz signals centered at 975 MHz and 1025 MHz. These two carrier aggregation signals may correspond to the primary cell and at least one secondary cell, for example. Although the two carrier aggregation signals can be received using two separate receivers at a user equipment (for example, a smart phone, cell phone, and/or the like), the use of two separate receivers may not be considered desirable in terms of power consumption and/or complexity, especially in the case of mobile wireless applications. Accordingly, in some example embodiments, a single receiver comprising a sigma delta receiver may be used to simultaneously receive both carrier aggregation signals.

The sigma delta receiver may refer to a receiver that includes an oversampled analog to digital (A/D) converter to convert the received radio frequency (RF) spectrum into the digital domain; and this oversampled A/D converter may operate at RF frequencies, rather than baseband frequencies. The sigma delta receiver may also include a loop filter to at least provide quantization noise shaping of the oversampled analog to digital converter output. Examples of sigma delta receivers can be found at Downconverting Sigma-Delta A/D Converter for a Reconfigurable RF Receiver, E. Winoto et al., Technical Report No. UCB/EECS-2009-81, May 21, 2009, and at A Wideband 400 MHZ-to-4 GHz Direct RF-to-Digital Multimode ΔΣ Receiver, C. Wu et al., IEEE Journal of Solid-State Circuits, Vol. 49, No. 7, July 2014.

In some example embodiments, a single sigma delta receiver may be used to receive both carrier signals transmitted in carrier aggregation. Referring to the previous example having two 10 MHz signals centered at 975 MHz and 1025 MHz, the sigma delta receiver may be clocked at the median frequency (which in this example is 1000 MHz). This sigma delta receiver may have its noise transfer function (NTF) configured to have notches at offset frequencies (which in this example is plus or minus 25 MHz) to enable the sigma delta receiver to simultaneously receive both signals.

FIG. 1A depicts a block diagram of a sigma delta receiver system 100, in accordance with some example embodiments. The description of FIG. 1A also refers to FIG. 1B.

The sigma delta receiver system 100 may include in-phase (I) branch 108 circuitry and quadrature (Q) phase branch 104 circuitry. The inputs to the in-phase branch 108 and the quadrature phase 104 branch may be coupled to a radio frequency input signal 102, an example of which is depicted at FIG. 1B.

Figure 1B:
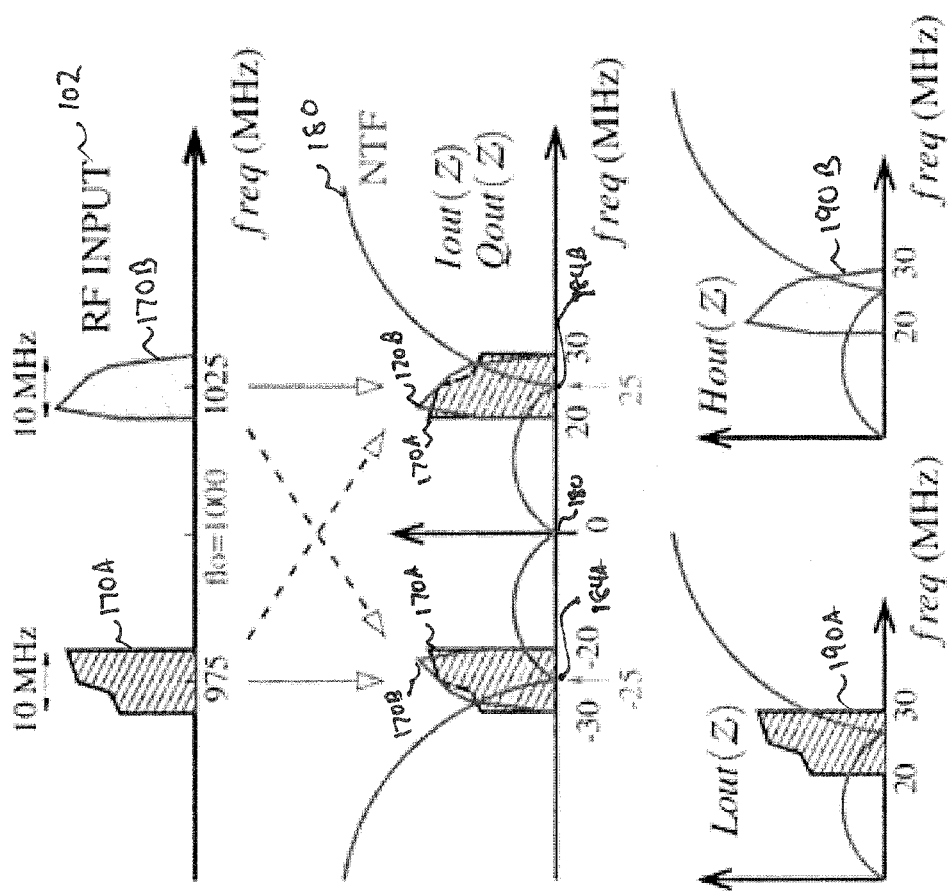
FIG. 1B depicts examples of plots associated with the sigma delta receiver of FIG. 1A, in accordance with some example embodiments.

In the example of FIG. 1A, the in-phase portion 108 and the quadrature portion 104 branch are clocked at 1000 MHz for example to enable reception of the RF input 102 comprising two carriers at 975 MHz and 1025 MHz, as shown at FIG. 1B at 170A-B. Moreover, the noise transfer function 180 of the in-phase portion 108 and the quadrature phase portion 104 may be adjusted to include zeroes at 975 MHz and 1025 MHz. Specifically, the sigma delta receiver 100 may, in this example, be clocked at rate of 1000 MHz, which is the median frequency between carriers 170A-B. Rather than having all of the zeroes at the median frequency, the noise transfer function of sigma delta receiver 100 may be configured to have zeroes 184A-B at the two carrier signals 170A-B. Accordingly, the I output (Iout(Z)) and Q output (Qout(Z)) are, in this example, at 1000 MHz plus 25 MHz 184B and 1000 MHz minus 25 MHz 184A, as shown at FIG. 1B.

Although the previous example includes symmetric passbands (for example, 10 MHz around plus and minus 25 MHz), the bandwidths of the high and low bands can be different (for example, 10 MHz for the low band and 5 MHz for the high band).

Although the example of FIG. 1A-1B refer to specific carrier frequencies and offsets at plus and minus (+/−) 25 MHz, the receiver 100 may be configured with other clocking frequencies and noise transfer functions to receive other frequencies carrying carrier aggregation signals.

In some example embodiments, the sigma delta receivers 104 and 108 may be coupled to signal cancelation circuitry to remove unwanted signals. In the example of FIG. 1A, the signal cancelation circuitry includes components 120, 125, 135, and 137 configured to remove the unwanted signals. For example, at the higher frequency of plus 25 MHz, components 120, 125, 135, and 137 may subtract out the low frequency carrier aggregation signal 170A (which is present by virtue of the "mixing" provided by the sigma delta receiver), as shown at 190B. At the lower frequency at minus 25 MHz, components 120, 125, 135, and 137 may subtract out the high frequency carrier aggregation signal 170B (which is present by virtue of the "mixing" providing by the sigma delta receiver) as shown at 190A.

To remove the unwanted signals noted above caused by sigma delta receiver mixing, the output of the quadrature phase branch 104 may be coupled to a 90 degree phase shifter, such as a Hilbert filter 120, in accordance with some example embodiments. The output of the in-phase 108 branch may be coupled to a delay cell(s) 125. Summer 135 may subtract the output of the Hilbert filter 120 from the delay cell 125 output. Summer 137 may add the output of the Hilbert filter 120 and the delay cell 125 output. In this way, the output, Lout(z), 150 represents the low frequency carrier aggregation signal (see, for example, 170A and 190A), and the output, Hout(z), 155 represents the high frequency carrier aggregation signal (see, for example, 170B and 190B).

Referring to delay cell 125, the delay may be selected, in some example embodiments, as a minus L/2 delay (where the delay, L, corresponds to the Hilbert filter order or delay of the Hilbert filter) to provide synchronization between the delay cell output 125 and the Hilbert filter output 120.

FIG. 1B plots the noise transfer function 180 superimposed over the sigma delta in-phase 108 output, Iout(Z), and the sigma delta quadrature phase 104 output, Qout(Z). In this example, moving two conjugate zeros from DC to ±25 MHz provides noise transfer function 180 having improved quantization noise and thus providing passbands at −30 MHz to −20 MHz and 20 MHz to 30 MHz for the low and high carrier aggregation signals.

The noise transfer function 180 of the sigma delta receivers 104 and 108 may, as noted, be adjusted by at least moving zeroes of the loop filter to the low and high frequencies. Although FIG. 1B shows the notch frequency established by moving the zeroes to the center of the passbands (see 184A and 184B, for example), in some example embodiments the optimal position of the zeroes may depend on one or more parameters including modulator order, offset frequency, signal bandwidth, and frequency clock (which may be generated by a local oscillator for example).

Figure 1C:
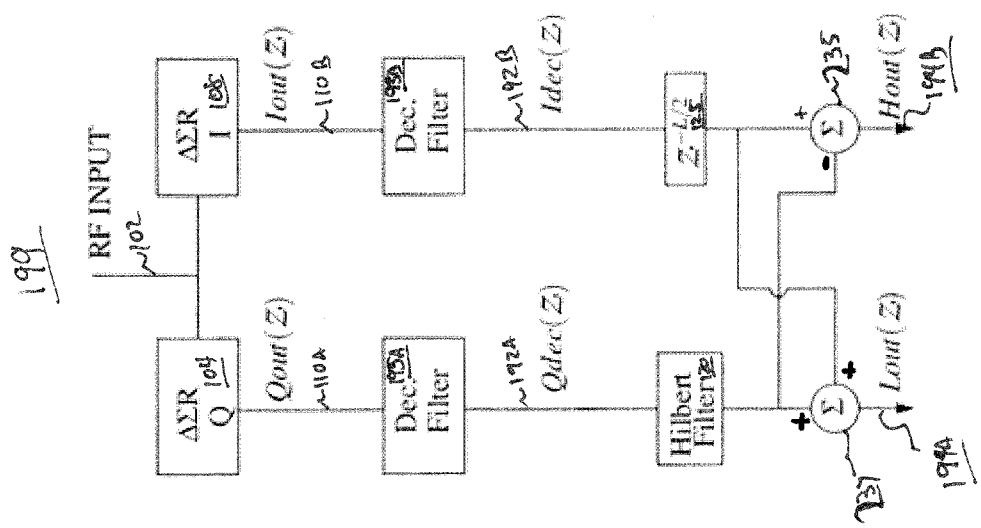
FIG. 1C depicts another example of a sigma delta receiver including decimation, in accordance with some example embodiments.

FIG. 1C depicts another block diagram of an example sigma delta receiver system 199, in accordance with some example embodiments. The description of FIG. 1C also refers to FIG. 1D.

Figure 1D:
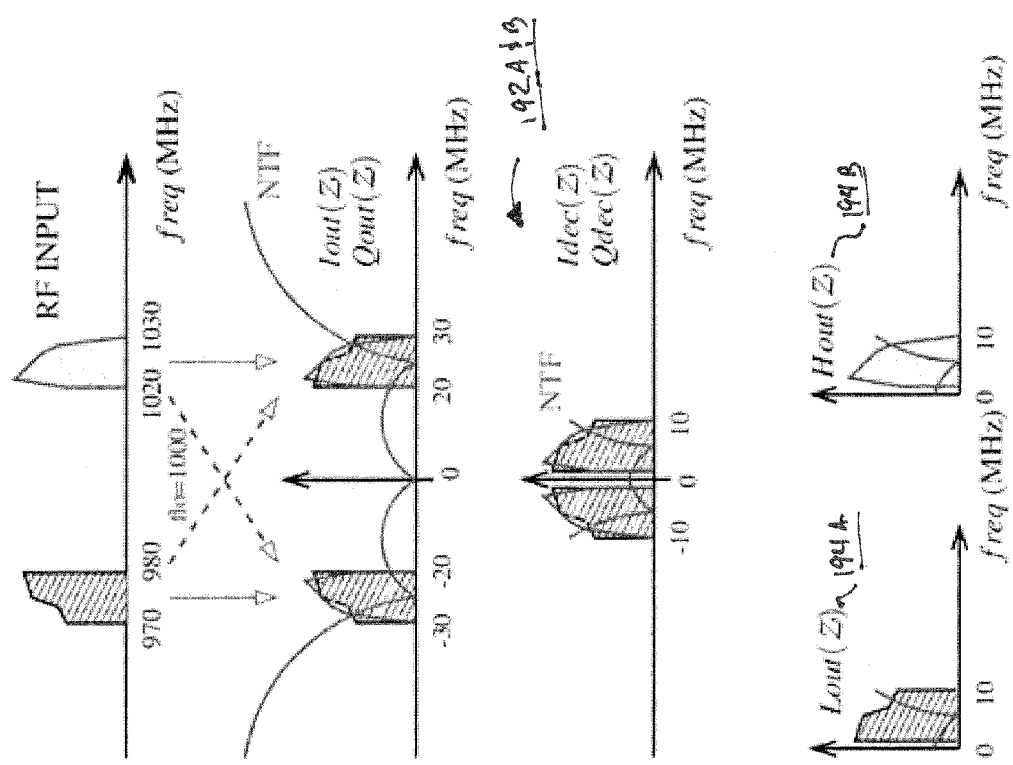
FIG. 1D depicts examples of plots associated with the sigma delta receiver of FIG. 1C, in accordance with some example embodiments.

FIG. 1C is similar to FIG. 1A in some respects but includes decimators 195A and 195B at the outputs of the sigma delta receivers 104 and 108 to reduce the sampling rate. Moreover, the summers 235 and 237 may be configured to operate at lower frequencies due to the decimation. As noted above, sigma delta receivers 104 and 108 oversample RF input 102, so decimation reduces or removes the oversampling. FIG. 1D depicts decimator output plots 192A-B. Plots 194A-B depict the high and low carrier aggregation signals after processing by the cancelation circuitry (for example, components 120, 125, 235, and 237) to remove the unwanted signals.

Figure 2:
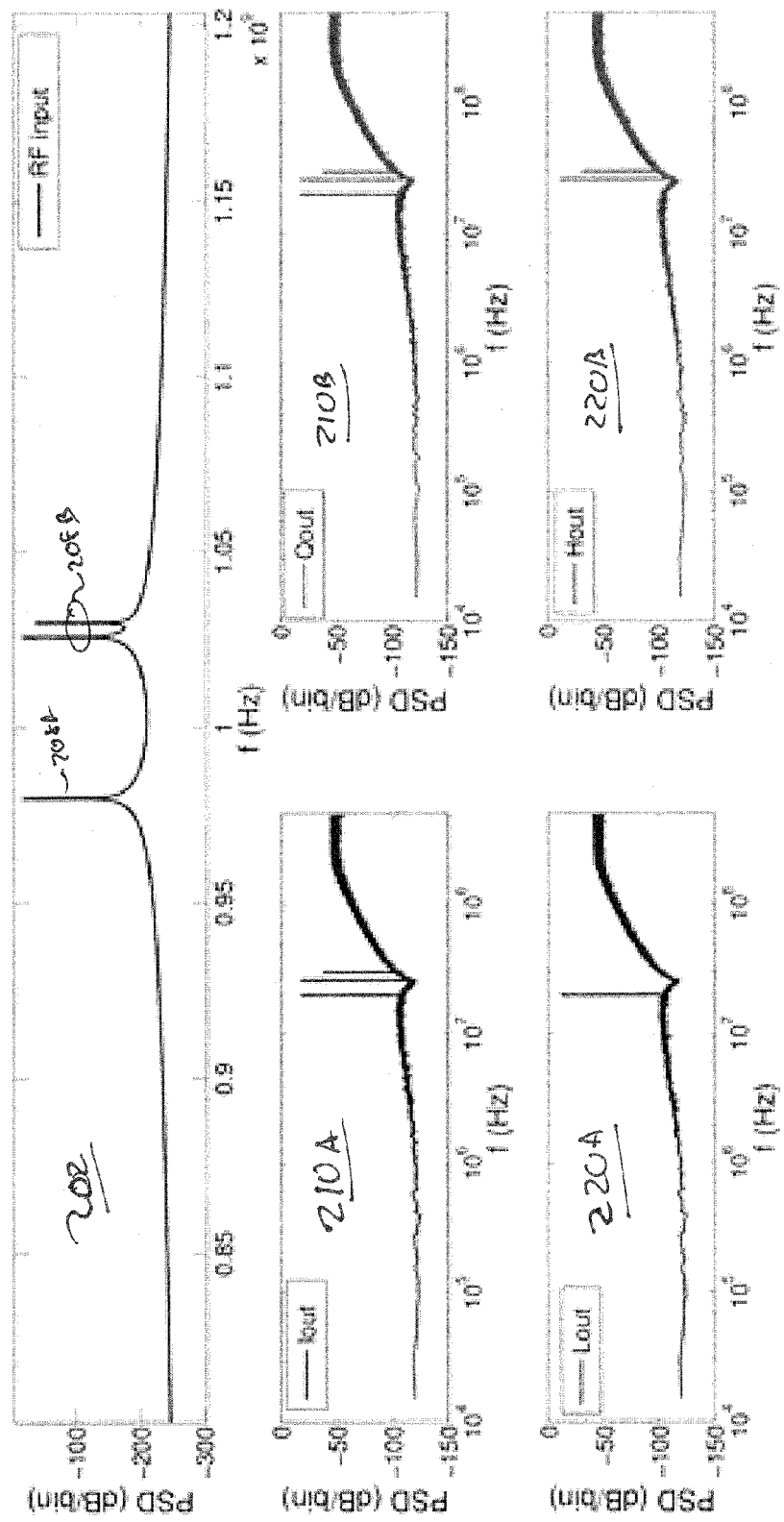
FIG. 2 depicts examples of plots of simulated data, in accordance with some example embodiments.

FIG. 2 depicts plots obtained from a simulation of the operation of system 100. The description of FIG. 2 also refers to FIG. 1A.

Plot 202 depicts RF input 102 (FIG. 1A). In the example shown, the higher band carrier aggregation signal 208B comprises two tones at 1026 MHz and 1029 MHz having a power of −15 dB relative to full scale and −35 dB relative to full scale. The lower band carrier aggregation signal 208A comprises a single tone at 979 MHz having a power of −15 dB relative to full scale. This RF input including signals 208A-B may be provided to I/Q sigma delta receivers 104/108 clocked with a local oscillator at 1 GHz. The I/Q sigma delta receivers 104/108 may be configured so that the noise transfer function includes notches (or zero(es)) at the offset frequencies corresponding to the high and low signals 208A-B.

Plots 210A-B show the Iout 110B and Qout 110A outputs of the I/Q sigma delta receivers 108/104. Specifically, plots 210A-B show a notch at 25 MHz which significantly reduces the quantization noise in the passbands. Plots 220A-B also show Lout 150 and Hout 155 after the image cancelation, which results in the low signal 208A and the high signal 208B. As can be seen from plots 220A-B, the high band signal 208B and the lower band signal have been separated by the signal cancelation stage comprising components 120, 125, 135, and 137.

Although FIGS. 1A and 1C depict two carriers, the sigma delta receiver may receive more than two carriers as well. For example, rather than move two zeroes to the higher and lower offset frequencies, additional zeroes may be moved from DC to other offset frequencies to provide the desired number of offset frequencies and thus passbands for desired number of carriers. For example, in a fourth order modulator, two additional zeros can be moved around (for example, plus and minus) a second offset frequency in order to receive four bands. The third zero may be moved in a third order modulator to a value different than DC by adding paths between the I and Q branches in order to create a complex noise transfer function.

Figure 3A:
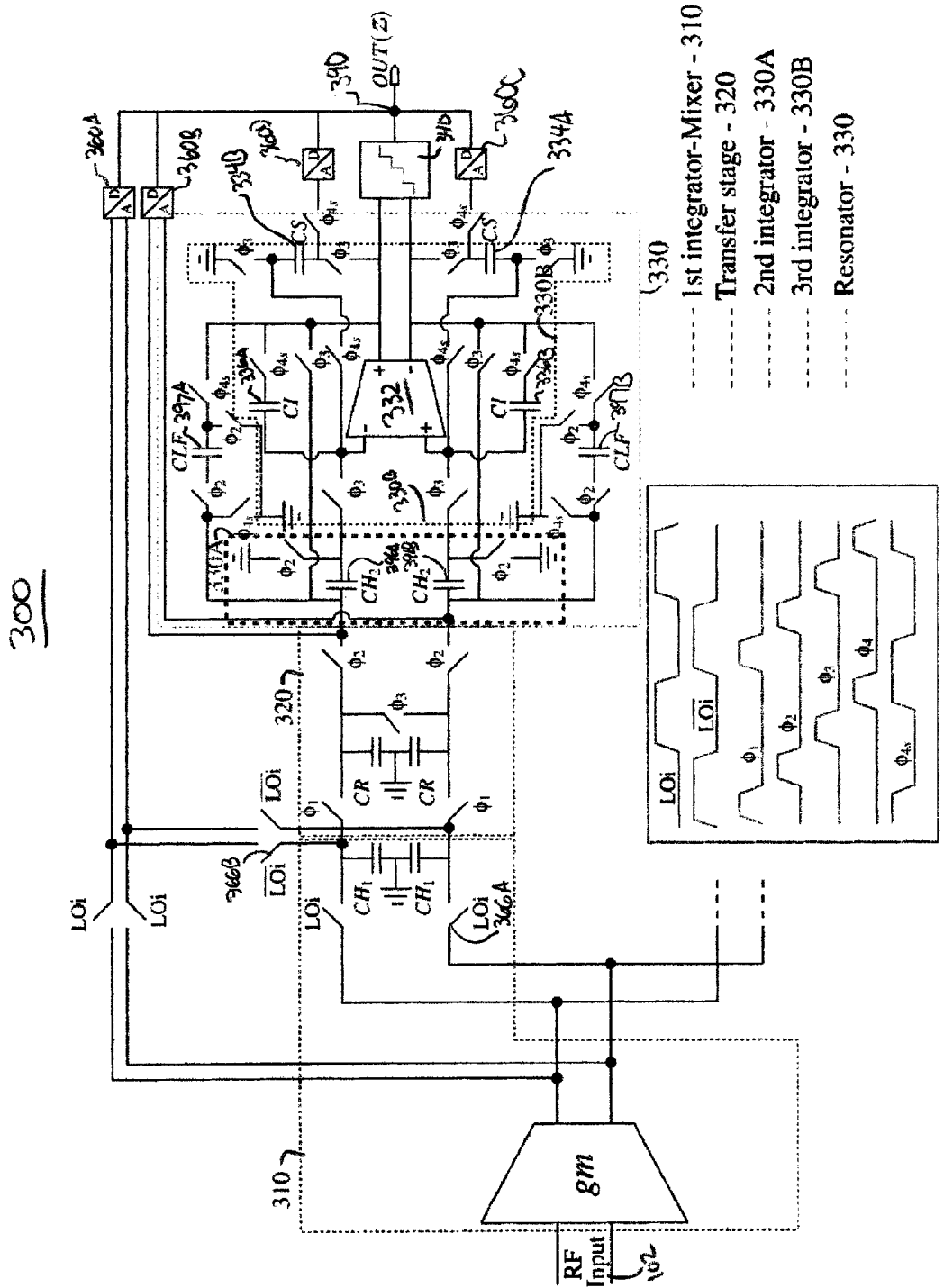
FIG. 3A depicts an example of a portion of the circuitry for the sigma delta receiver, in accordance with some example embodiments.

FIG. 3A depicts a block diagram of a sigma delta receiver system 300, in accordance with some example embodiments. Specifically, system 300 may provide one of the branches of sigma delta receivers (for example, Q branch 104, although system 300 may be used for I branch 108 as well), in accordance with some example embodiments. The sigma delta receivers may also be implemented as continuous time delta sigma receivers as well.

RF inputs 102 may be coupled to the sigma delta receiver's integrator-mixer stage 310, which may be further connected to a transfer capacitance stage 320, which may be further connected to stage 330A to implement the second integrator stage circuitry. Stage 330A is then connected to a third integrator stage 330B (which may be a third order integrator stage, for example), in accordance with some example embodiments.

Although FIG. 3A depicts a dual or differential signal input at 102, a single ended RF input may be used as well. Moreover, although the RF signal 102 may represent the signals of interest at the transmitted RF frequencies, the RF signal 102 may, in some example embodiments, undergo some down conversion as well.

In some example embodiments, the integrator stage 330B may be further coupled to a quantizer stage 340, the output 390 of which provides loop filter feedback (in digital form via digital to analog converter stage 360A-D). The output may also correspond to Qout(Z) 110A at FIG. 1A (in the case of an in-phase implementation) or Iout(Z) 110B (in the case of a quadrature phase implementation).

In some example embodiments, the capacitance values (as described further below with respect to Equation 1) of the resonator stage 330 (which includes stages 330A and B) may be varied to move the zeroes from DC to the desired offset frequencies of the carrier aggregation signals. For example, a controller may vary the capacitance values in order to provide passbands for the carrier aggregation signals.

In the example embodiment of FIG. 3A, a third order sigma delta receiver is depicted. The first stage integrator-mixer stage 310 may include a transconductance amplifier (labeled gm) coupled to integration capacitors $CH_1$ and corresponding switches LOi. The charge stored by the capacitors $CH_1$ may be shared with transfer capacitor stage 320 including transfer capacitors CR during time period $\Phi_1$ (during which the switches labeled $\Phi_1$ are closed). The value of the transfer capacitors CR may be chosen to be relatively small with respect to first stage capacitors $CH_1$ to provide a relatively good leakage factor.

During time period $\Phi_2$ (during which the switches labeled $\Phi_2$ are closed), the charge stored on transfer capacitors CR of the transfer capacitor stage 320 may be shared with the second integration stage circuitry 330A and, in particular, integration capacitors $CH_2$ 396A-B. This sharing enables the second integrator to receive a charge. The attenuation caused by the passive charge transfer is given by (CR*CH2)/[CH1*(CH2+CR)]. To avoid further signal attenuation, an active integrator 330B may be implemented as shown. The active integrator may include an operational transconductance amplifier (OTA) 332 coupled via switches $\Phi_2$ to sampling capacitors CS 334A-B and via switches $\Phi_4$ to integration capacitors CI 336A-B.

Figure 3B:
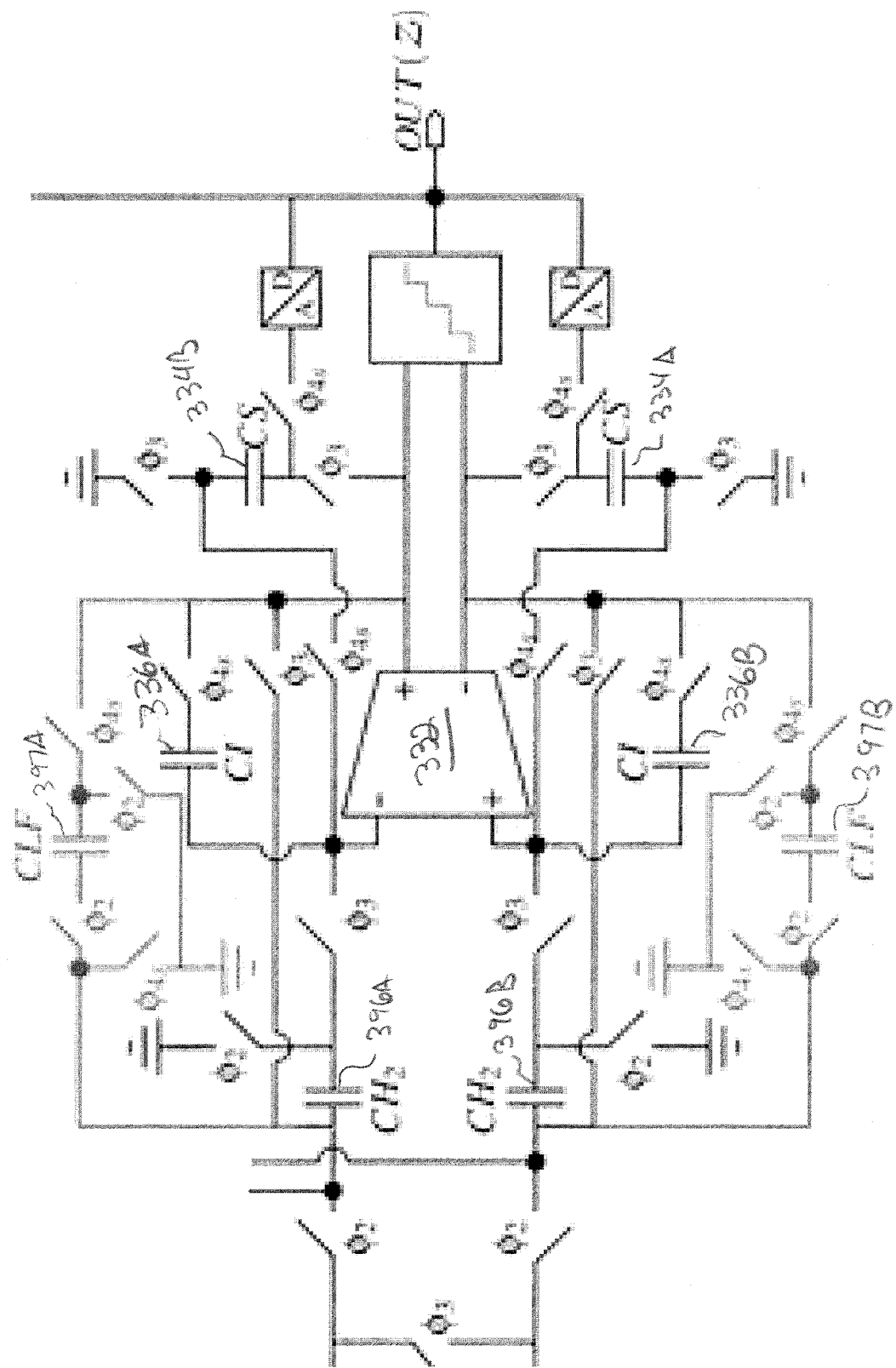
FIG. 3B depicts an enlarged portion of the circuitry of FIG. 3A, in accordance with some example embodiments.

FIG. 3B depicts an enlarged portion of FIG. 3A. During time period $\Phi_3$ (during which the switches labeled $\Phi_3$ are closed), OTA 332 copies the $CH_2$ voltage (at $CH_2$ capacitors 396A-B) to sampling capacitors CS 334A-B; and then this voltage is integrated, during time period $\Phi_4$ (during which the switches labeled $\Phi_4$ are closed), with integration capacitors CI 336A-B.

Without the capacitor network of capacitors CLF 397A-B, the receiver circuit would provide a third order sigma delta receiver having 3 zeros at baseband (or DC). The capacitor network of capacitors CLF 397A-B may be configured to enable movement of two of the zeros to offset frequencies providing notches, such as +/−Fnotch at 184A-B. The frequency of the Fnotch may be configured based on the values of the capacitors CLF 397A-B, $CH_2$ 396A-B, CS 334A-B, and/or CI 336A-B, in accordance with some example embodiments. Moreover, this Fnotch frequency may be determined based on, in some example embodiments, on the following equation:

$$Fnotch = \tan^{-1}\left(\frac{\sqrt{\frac{CS}{CI} \cdot \frac{CLF}{CH2}}}{2\pi}\right) \cdot flo, \quad \text{Equation 1}$$

wherein flo represents the clocked frequency of the local oscillators (see, for example $LO_i$ 366A at FIG. 3A and the inverted $LO_i$ 366B).

Figure 4:
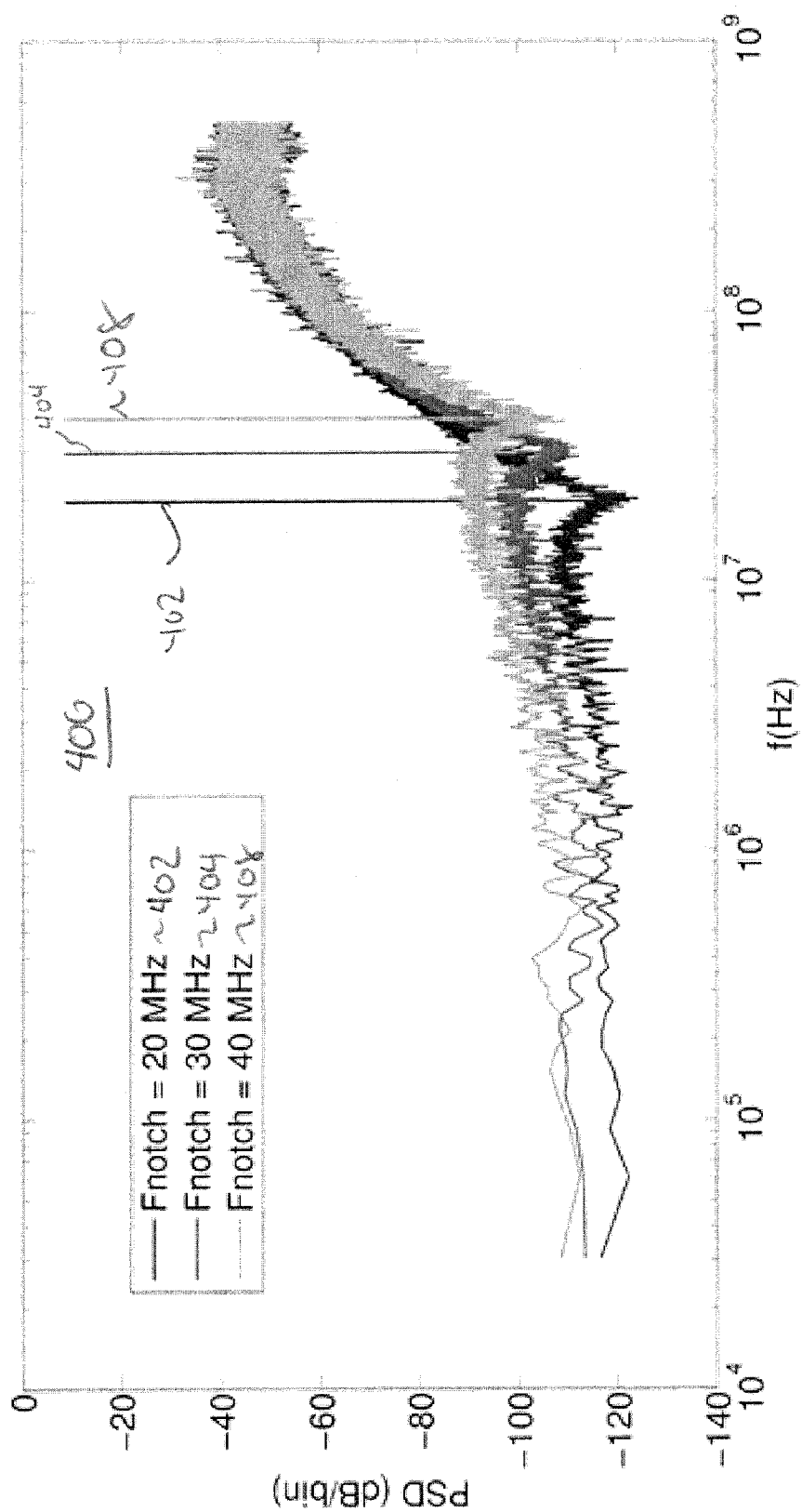
FIG. 4 depicts plots showing the effects of varying the capacitance of the third stage of the sigma delta receiver in order to move the notch frequencies, in accordance with some example embodiments.

FIG. 4 depicts a plot 400 of a simulation of the system 300, in accordance with some example embodiments. In the simulation, system 300 is configured with a local oscillator (LOi) at 1 GHz; capacitor $CH_1$ equals 10 picofarads (pF), CR equals 100 femtofarads (fF), $CH_2$ equals 10 pF, $CS_1$ equals 1 pF, and CI equals 250 fF. Moreover, the capacitor values of CLF are varied among the following values: 40 femtofarads (fF), 90 fF and 160 fF. As can be seen, by adjusting the value of CLF, the notch frequency varies from 20 MHz 402, 30 MHz 404, to 40 MHz 408, in accordance with Equation 1 above. Although the previous example describes varying CLF, the other capacitors can be varied, such as CS, CI, and $CH_2$.

In some example embodiments, the capacitors can be varied dynamically using a variable capacitor (for example, a capacitor bank which can have its capacitor varied and/or the like). For example, control circuitry may switch in (or out) one or more capacitors to provide a given capacitor value in order to vary the capacitance values of the CLF for example, and thus select the notch frequency offset values. By choosing the notch frequency offset value (such as plus or minus 25 MHz although other values may be implemented as well), the receiver 300 may be configured to receive different carriers simultaneously, and these carrier aggregation carriers may be in contiguous bands or non-contiguous bands of carrier aggregation. Moreover, the depth of the notch frequency may also be configured in accordance with some example embodiments by varying for example the ratio of the capacitance values of $CH_2$ and CLF (for example, a higher the ratio may provide a deeper notch).

In some example embodiments, the sigma delta receiver described herein may be implemented in a user equipment, such as a mobile station, a mobile unit, a subscriber station, a wireless terminal, a tablet, a smart phone, a vehicle, a wireless plug-in accessory, and/or any other wireless device. For example, the sigma delta receiver described herein may be configured to receive multiple carriers in carrier aggregation.

Figure 5:
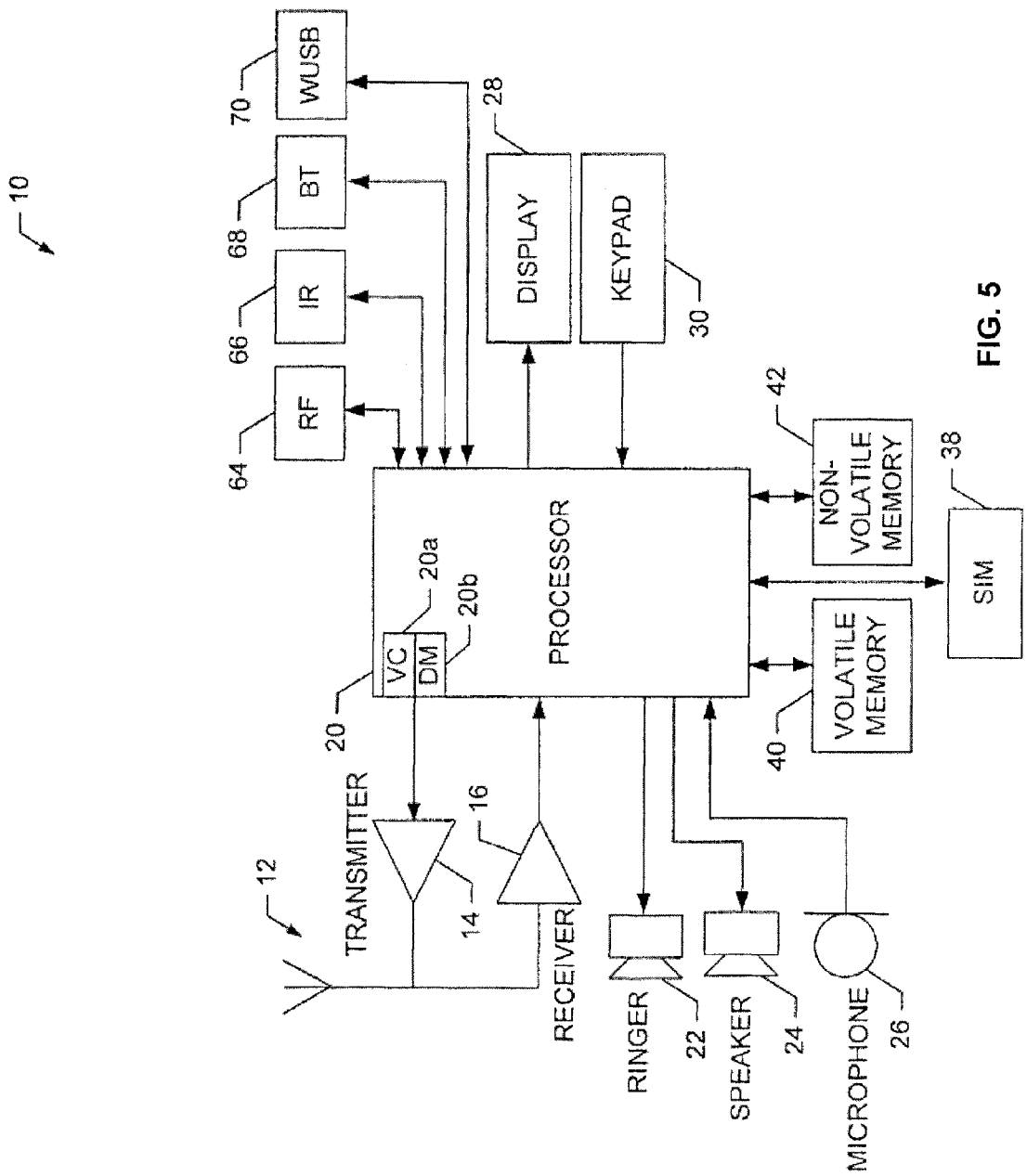
FIG. 5 depicts an example of a radio, in accordance with some example embodiments.

FIG. 5 depicts a block diagram of a radio 10 that may be used as user equipment including the sigma delta receiver, in accordance with some example embodiments.

The radio may include at least one antenna 12 in communication with a transmitter 14 and a receiver 16. Alternatively transmit and receive antennas may be separate.

In some example embodiments, receiver 16 may include the sigma delta receiver, such as receivers 100, 199, or 300. Moreover, the sigma delta receiver may be configured to receive a plurality of carrier aggregation carrier signals at different frequencies, such as a first carrier referred to as a primary cell and one or more secondary cell carriers.

The apparatus 10 may also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 5 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, fifth-generation (5G) communication protocols, Internet Protocol Multimedia Subsystem (IMS) communication protocols (for example, session initiation protocol (SIP) and/or any subsequent revisions or improvements to these standards. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced, LTE-Direct, LTE-Unlicensed, and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 5, apparatus 10 may also include one or more mechanisms for sharing and/or obtaining data. For example, the apparatus 10 may include a short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth™ (BT) transceiver 68 operating using Bluetooth™ wireless technology, a wireless universal serial bus (USB) transceiver 70, a Bluetooth™ Low Energy transceiver, a ZigBee transceiver, an ANT transceiver, a cellular device-to-device transceiver, a wireless local area link transceiver, and/or any other short-range radio technology. Apparatus 10 and, in particular, the short-range transceiver may be capable of transmitting data to and/or receiving data from electronic devices within the proximity of the apparatus, such as within 10 meters, for example. The apparatus 10 including the Wi-Fi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), a eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing functions of the user equipment configured with the sigma delta receiver disclosed herein. The memories may comprise an identifier, such as an international mobile equipment identification (IMEI) code, capable of uniquely identifying apparatus 10. The functions may include one or more of the user equipment operations disclosed with respect to the sigma delta receivers and the like. In the example embodiment, the processor 20 may be configured using computer code stored at memory 40 and/or 42 to perform operations as disclosed herein including receiving, at a first radio frequency input port of an in-phase sigma delta receiver, a signal comprising a first carrier aggregation signal and a second carrier aggregation signal; receiving at a second radio frequency input port of a quadrature phase sigma delta receiver, the signal comprising the first carrier aggregation signal and the second carrier aggregation, wherein the in-phase sigma delta receiver and the quadrature phase sigma delta receiver each include a resonator stage circuitry including at least one variable capacitor that varies notch frequencies to provide passbands for the first carrier aggregation signal and the second carrier aggregation signal, and/or the like as disclosed herein with respect to the sigma delta receivers and systems 100, 199, and 300.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIG. 5, computer-readable medium may comprise a non-transitory computer-readable storage medium that may be any media that can contain or store the instructions for use by or in connection with an instruction execution system, apparatus, or device, such as a computer.

Without in any way limiting the scope, interpretation, or application of the claims appearing herein, a technical effect of one or more of the example embodiments disclosed herein may provide a single receiver configured to receive a plurality of carrier aggregation signals. Moreover, without in any way limiting the scope, interpretation, or application of the claims appearing herein, a technical effect of one or more of the example embodiments disclosed herein may include a reduction in power consumption, when compared to using a plurality of receivers to receive the carrier aggregation signals.

The subject matter described herein may be embodied in systems, apparatus, methods, and/or articles depending on the desired configuration. For example, the base stations and user equipment (or one or more components therein) and/or the processes described herein can be implemented using one or more of the following: a processor executing program code, an application-specific integrated circuit (ASIC), a digital signal processor (DSP), an embedded processor, a field programmable gate array (FPGA), and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "computer-readable medium" refers to any computer program product, machine-readable medium, computer-readable storage medium, apparatus and/or device (for example, magnetic discs, optical disks, memory, Programmable Logic Devices (PLDs)) used to provide machine instructions and/or data to a programmable processor, including a machine-readable medium that receives machine instructions. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. Moreover, the implementations described above may be directed to various combinations and subcombinations of the disclosed features and/or combinations and subcombinations of several further features disclosed above. Other embodiments may be within the scope of the following claims.

The different functions discussed herein may be performed in a different order and/or concurrently with each other. Furthermore, one or more of the above-described functions may be optional or may be combined. Although various aspects of the invention are set out in the independent claims, other aspects of the invention comprise other combinations of features from the described embodiments and/or the dependent claims with the features of the independent claims, and not solely the combinations explicitly set out in the claims. It is also noted herein that while the above describes example embodiments of the invention, these descriptions should not be viewed in a limiting sense. Rather, there are several variations and modifications, which may be made without departing from the scope of the present invention as, defined in the appended claims. The term "based on" includes "based on at least."

What is claimed:

1. An apparatus comprising:
    an in-phase sigma delta receiver coupled to a radio frequency input port providing at least a first carrier aggregation signal and a second carrier aggregation signal; and
    a quadrature phase sigma delta receiver coupled to the radio frequency input port providing at least the first carrier aggregation signal and the second aggregation signal, wherein the in-phase sigma delta receiver and the quadrature phase sigma delta receiver each include a resonator stage circuitry including at least one variable capacitor that varies notch frequencies to provide passbands for the first carrier aggregation signal and the second carrier aggregation signal, wherein the at least one variable capacitor comprises a loop filter capacitor coupled to an output of an operational transconductance amplifier and coupled to an integration capacitor.

2. The apparatus of claim 1, wherein the resonator stage circuitry includes at least one additional integration stage including the at least one variable capacitor.

3. The apparatus of claim 1, wherein the at least one variable capacitor varies the notch frequencies by at least moving zeroes of a second order and/or higher order loop filter of the resonator stage circuitry.

4. The apparatus of claim 1, wherein the at least one variable capacitor comprises at least one of a first integration capacitor, a second integration capacitor, a third integration capacitor, or a sampling capacitor.

5. The apparatus of claim 4, the apparatus further comprising:
a mixer stage to downsample a signal received from the radio frequency input port, wherein the mixer stage further includes the first integration capacitor, and wherein the first integration capacitor is further coupled to a transfer capacitance stage circuitry.

6. The apparatus of claim 4, wherein the resonator stage circuitry includes the second integration capacitor coupled on a first side to the transfer capacitance stage circuitry and on a second side to an input of an operational transconductance amplifier.

7. The apparatus of claim 6, wherein the resonator stage circuitry includes the loop filter capacitor coupled to the output of the operational transconductance amplifier, and wherein the second integration capacitor comprises the integration capacitor.

8. The apparatus of claim 6, wherein the resonator stage circuitry includes the third integration capacitor coupled to an output of the operational transconductance amplifier and a quantizer input.

9. The apparatus of claim 6, wherein the resonator stage circuitry includes the sampling capacitor coupled to the input of the operational transconductance amplifier, and wherein the sampling capacitor is further coupled to an output of the operational transconductance amplifier.

10. The apparatus of claim 1 further comprising:
at least one decimator coupled to the in-phase sigma delta receiver and the quadrature phase sigma delta receiver.

11. The apparatus of claim 1 further comprising:
signal cancellation circuitry to remove at least one unwanted signal from an output signal generated by the in-phase sigma delta receiver and the quadrature phase sigma delta receiver.

12. The apparatus of claim 11, wherein the signal cancelation circuitry comprises a 90 degree phase shifter, delay circuitry, and at least one combiner.

13. The apparatus of claim 1, wherein the apparatus is included in a user equipment.

14. The apparatus of claim 1, wherein the radio frequency input port is configured to receive at least a down converted signal at an intermediate frequency.

15. A method comprising:
receiving, at a first radio frequency input port of an in-phase sigma delta receiver, a signal comprising a first carrier aggregation signal and a second carrier aggregation signal; and
receiving, at a second radio frequency input port of a quadrature phase sigma delta receiver, the signal comprising the first carrier aggregation signal and the second carrier aggregation, wherein the in-phase sigma delta receiver and the quadrature phase sigma delta receiver each include a resonator stage circuitry including at least one variable capacitor that varies notch frequencies to provide passbands for the first carrier aggregation signal and the second carrier aggregation signal, wherein the at least one variable capacitor comprises a loop filter capacitor coupled to an output of an operational transconductance amplifier and coupled to an integration capacitor.

16. The method of claim 15, wherein the resonator stage circuitry includes at least one additional integration stage including the at least one variable capacitor.

17. The method of claim 15, wherein the at least one variable capacitor varies the notch frequencies by at least moving zeroes of a second order and/or higher order loop filter of the resonator stage circuitry.

18. The method of claim 15, wherein the at least one variable capacitor comprises at least one of a first integration capacitor, a second integration capacitor, a third integration capacitor, or a sampling capacitor.

19. The method of claim 18 further comprising:
downsampling, at a mixer stage, the received signal, wherein the mixer stage further includes the first integration capacitor, and wherein the first integration capacitor is further coupled to a transfer capacitance stage circuitry.

20. The method of claim 18, wherein the resonator stage circuitry includes the second integration capacitor coupled on a first side to a transfer capacitance stage circuitry and on a second side to an input of an operational transconductance amplifier.

* * * * *